US009007085B2

(12) United States Patent
Seo

(10) Patent No.: US 9,007,085 B2
(45) Date of Patent: Apr. 14, 2015

(54) TEST APPARATUS OF SEMICONDUCTOR PACKAGE AND METHODS OF TESTING THE SEMICONDUCTOR PACKAGE USING THE SAME

(75) Inventor: Hunkyo Seo, Asan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 399 days.

(21) Appl. No.: 13/532,982

(22) Filed: Jun. 26, 2012

(65) Prior Publication Data

US 2013/0113513 A1    May 9, 2013

(30) Foreign Application Priority Data

Nov. 8, 2011    (KR) ........................ 10-2011-0115739

(51) Int. Cl.
*G01R 31/00*      (2006.01)
*G01R 1/04*      (2006.01)
*G01R 31/28*      (2006.01)

(52) U.S. Cl.
CPC ............ *G01R 1/0483* (2013.01); *G01R 1/0466* (2013.01); *G01R 31/2891* (2013.01)

(58) Field of Classification Search
USPC ........................................ 324/756.02, 750.16
See application file for complete search history.

(56) References Cited

U.S. PATENT DOCUMENTS 8,044,673 B1 * 10/2011 Burgyan .................. 324/750.16
2008/0238462 A1   10/2008 Hartmann et al.

FOREIGN PATENT DOCUMENTS

| KR | 10-0691242 | 2/2007 |
|---|---|---|
| KR | 10-0713579 | 4/2007 |
| KR | 10-0929244 | 11/2009 |

* cited by examiner

*Primary Examiner* — Vincent Q Nguyen
(74) *Attorney, Agent, or Firm* — Lee & Morse, P.C.

(57) ABSTRACT

A semiconductor package testing apparatus and testing a semiconductor package, the apparatus including a test circuit substrate that electrically tests a semiconductor package having connection terminals; a socket electrically connecting the test circuit substrate with the semiconductor package; a socket guide having an open region delimiting the socket; an insert that fixes the semiconductor package and positions the semiconductor package in the open region of the socket guide; a pusher that presses the semiconductor package to make contact between the socket and the semiconductor package; and an alignment part that aligns the semiconductor package with the open region, wherein the alignment part is configured to selectively apply a magnetic force to align keys of the semiconductor package, the align keys being formed of a magnetic material.

12 Claims, 4 Drawing Sheets

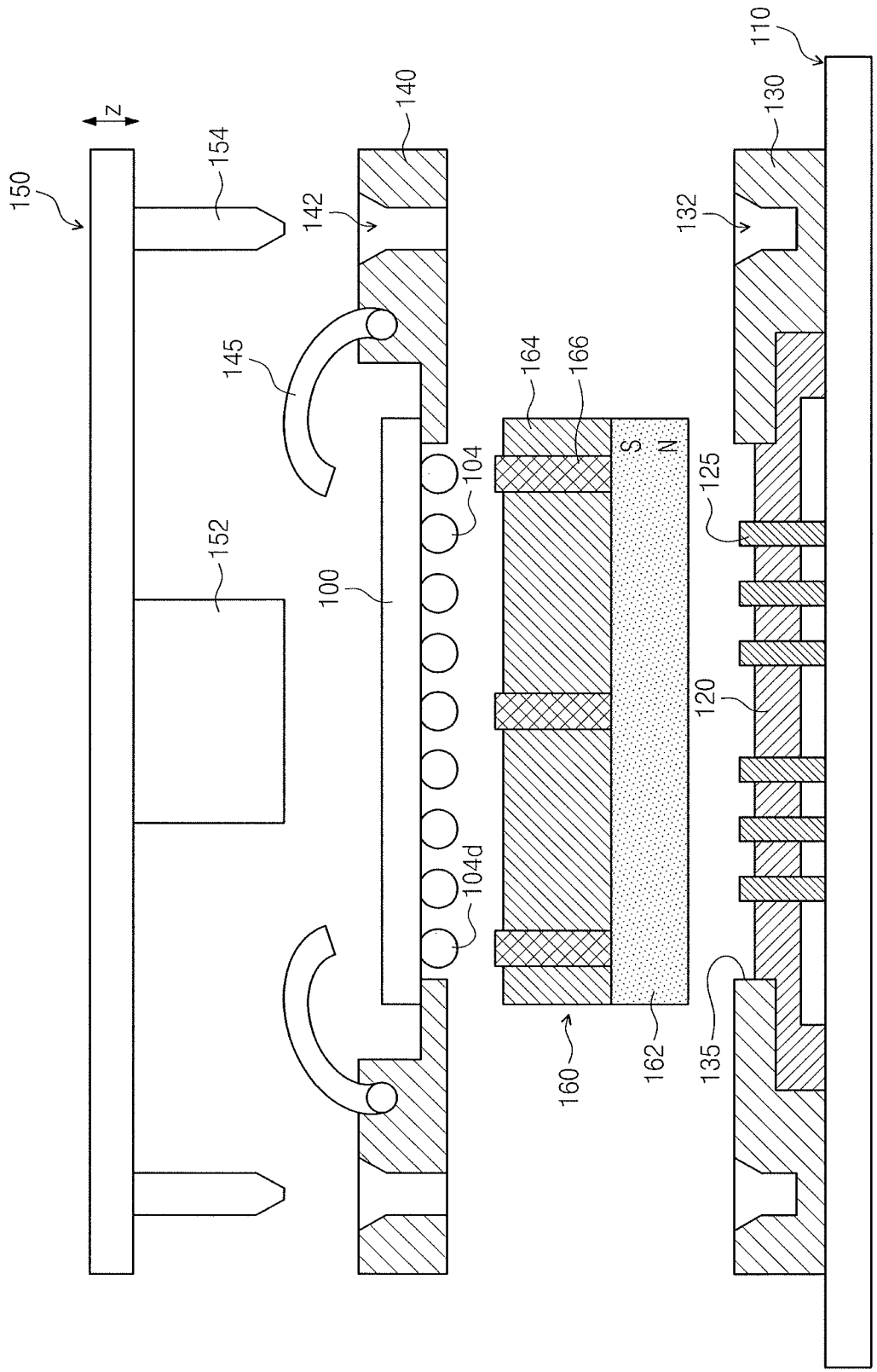

TEST APPARATUS OF SEMICONDUCTOR PACKAGE AND METHODS OF TESTING THE SEMICONDUCTOR PACKAGE USING THE SAME

CROSS-REFERENCE TO RELATED APPLICATIONS

Korean Patent Application No. 10-2011-0115739, filed on Nov. 8, 2011, in the Korean Intellectual Property Office, and entitled "TEST APPARATUS OF SEMICONDUCTOR PACKAGE AND METHODS OF TESTING THE SEMICONDUCTOR PACKAGE USING THE SAME," is hereby incorporated herein by reference in its entirety.

BACKGROUND

1. Field

Embodiments relate to test apparatus of a semiconductor package and methods of testing the semiconductor package using the same.

2. Description of the Related Art

After a front-end process is completed, semiconductor chips obtained from a wafer may be packaged through an assembly process and then may be tested to examine electric characteristics thereof.

The testing process may include an electric test (to examine electric characteristics or defectiveness of the semiconductor chip) and a burn-in test (which may be performed under severe test conditions (e.g., at higher temperature, higher voltage, and higher current than those of the normal operation condition) to examine a life-time or defectiveness of the semiconductor chip).

The electric test may be performed under a test condition in which all I/O terminals of the semiconductor chip are in contact with a test circuit substrate having a test-signal-generating circuit. Thus, whether the semiconductor chip is normally operated and whether there is an electric open in the semiconductor chip may be examined. For example, a handler may be used to perform the electric test.

SUMMARY

Embodiments are directed to test apparatus of a semiconductor package and methods of testing the semiconductor package using the same.

The embodiments may be realized by providing a semiconductor package testing apparatus including a test circuit substrate that electrically tests a semiconductor package having connection terminals; a socket electrically connecting the test circuit substrate with the semiconductor package; a socket guide having an open region delimiting the socket; an insert that fixes the semiconductor package and positions the semiconductor package in the open region of the socket guide; a pusher that presses the semiconductor package to make contact between the socket and the semiconductor package; and an alignment part that aligns the semiconductor package with the open region, wherein the alignment part is configured to selectively apply a magnetic force to align keys of the semiconductor package, the align keys being formed of a magnetic material.

The align keys of the semiconductor package may be formed of a ferromagnetic material.

The align keys of the semiconductor package may be dummy pads.

The align keys of the semiconductor package may be provided in a form of a dummy solder ball.

The alignment part may include a magnet portion that applies the magnetic force to the align keys of the semiconductor package; a magnetic shielding portion on the magnet portion; and alignment pins connected to the magnet portion through the magnetic shielding portion, the alignment pins being magnetic elements corresponding to the align keys of the semiconductor package.

The alignment pins may be formed of a ferromagnetic material.

The magnet portion may be disposed within the socket, and the alignment pins may be connected to the magnet portion through the socket.

The insert may further include a latch for fixing the semiconductor package aligned by the alignment part.

The socket may include contact terminals corresponding to the connection terminals of the semiconductor package.

The embodiments may also be realized by providing a method of testing a semiconductor package, the method including preparing the semiconductor package such that the semiconductor package includes connection terminals and align keys and the align keys are formed of a magnetic material; selectively applying a first magnetic force to the align keys of the semiconductor package to align the connection terminals of the semiconductor package with corresponding contact terminals of a socket; and testing the semiconductor package.

The method may further include loading the semiconductor package on an insert, and fixing the semiconductor package to the insert, after aligning the connection terminals to the corresponding contact terminals.

The method may further include selectively applying a second magnetic force having a direction opposite to that of the first magnetic force to the align keys of the semiconductor package, after aligning the connection terminals with the corresponding contact terminals.

The method may further include pressing the semiconductor package such that the contact terminals of the socket contact the connection terminals of the semiconductor package.

The align keys of the semiconductor package may be dummy pads.

The align keys of the semiconductor package may be provided in a form of a dummy solder ball.

The embodiments may also be realized by providing a testing apparatus for testing a semiconductor package having connection terminals and magnetic align keys, the apparatus including a test circuit substrate having a test circuit; a socket, the socket including contact terminals that electrically connect the test circuit substrate with the semiconductor package; a socket guide, the socket guide having an opening accommodating the socket; and an alignment part, the alignment part selectively applying a magnetic force to the align keys of the semiconductor package and aligning the semiconductor package with the opening.

The align keys of the semiconductor package may be provided in a form of dummy solder balls or dummy pads.

The alignment part may include a magnet portion, the magnet portion applying the magnetic force to the align keys of the semiconductor package; a magnetic shielding portion on the magnet portion; and alignment pins connected to the magnet portion through the magnetic shielding portion, the alignment pins being magnetic elements that correspond to the align keys of the semiconductor package.

The magnet portion may be disposed within the socket, and the alignment pins may be connected to the magnet portion through the socket.

The apparatus may further include an insert, the insert fixing the aligned semiconductor package on the opening of the socket guide, wherein the insert further includes a latch, the latch fixing the semiconductor package aligned by the alignment part.

BRIEF DESCRIPTION OF THE DRAWINGS

Features will become apparent to those of ordinary skill in the art by describing in detail exemplary embodiments with reference to the attached drawings in which:

FIG. 4 illustrates a sectional view schematically showing an apparatus for testing a semiconductor package according to an embodiment.

DETAILED DESCRIPTION

Figure 1:
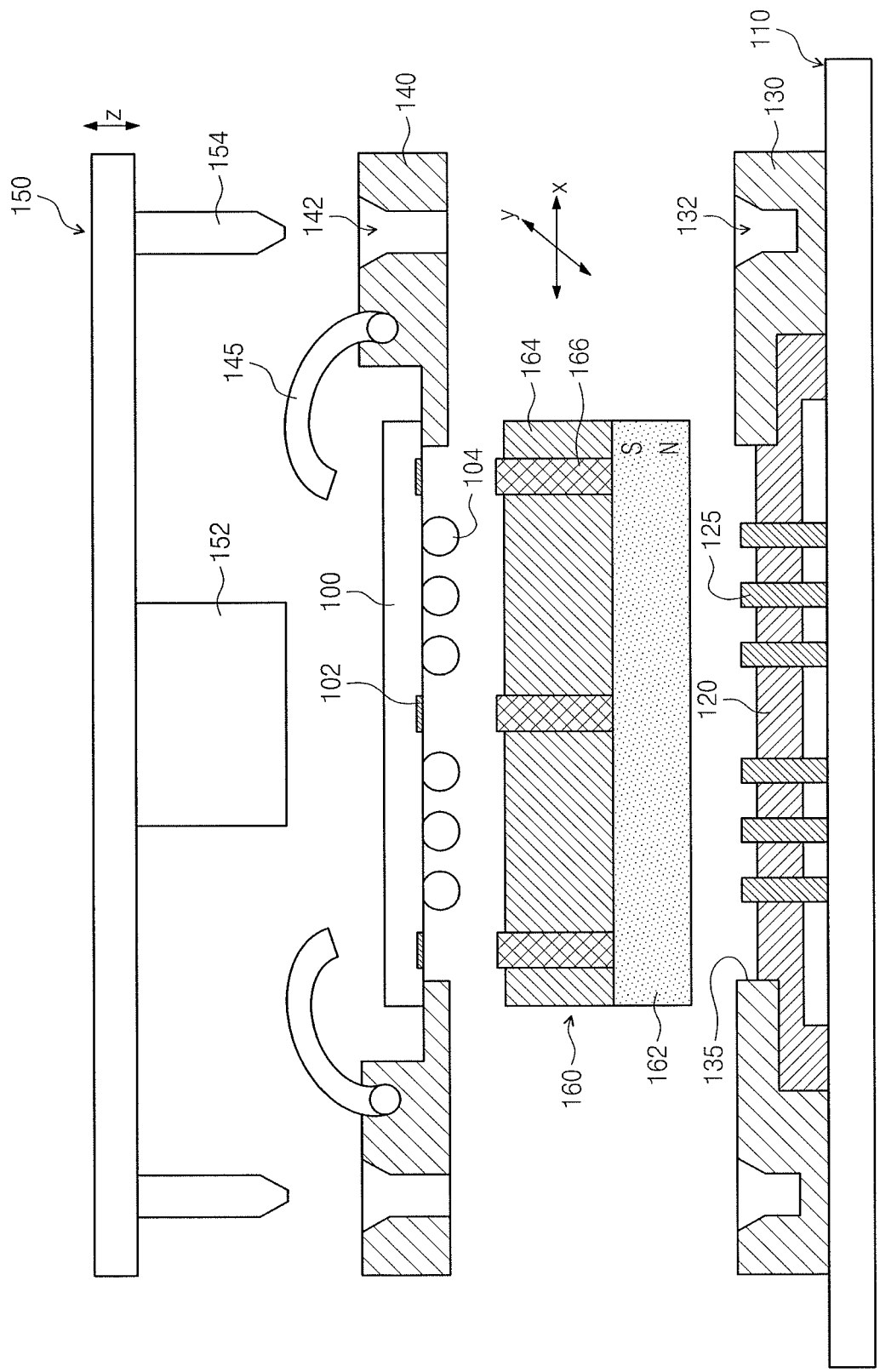
FIGS. 1 and 2 illustrate sectional views schematically showing an apparatus and a method for testing a semiconductor package according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another element, it can be directly on the other element, or intervening elements may also be present. In addition, it will also be understood that when an element is referred to as being "between" two elements, it can be the only element between the two elements, or one or more intervening elements may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "adjacent" versus "directly adjacent").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
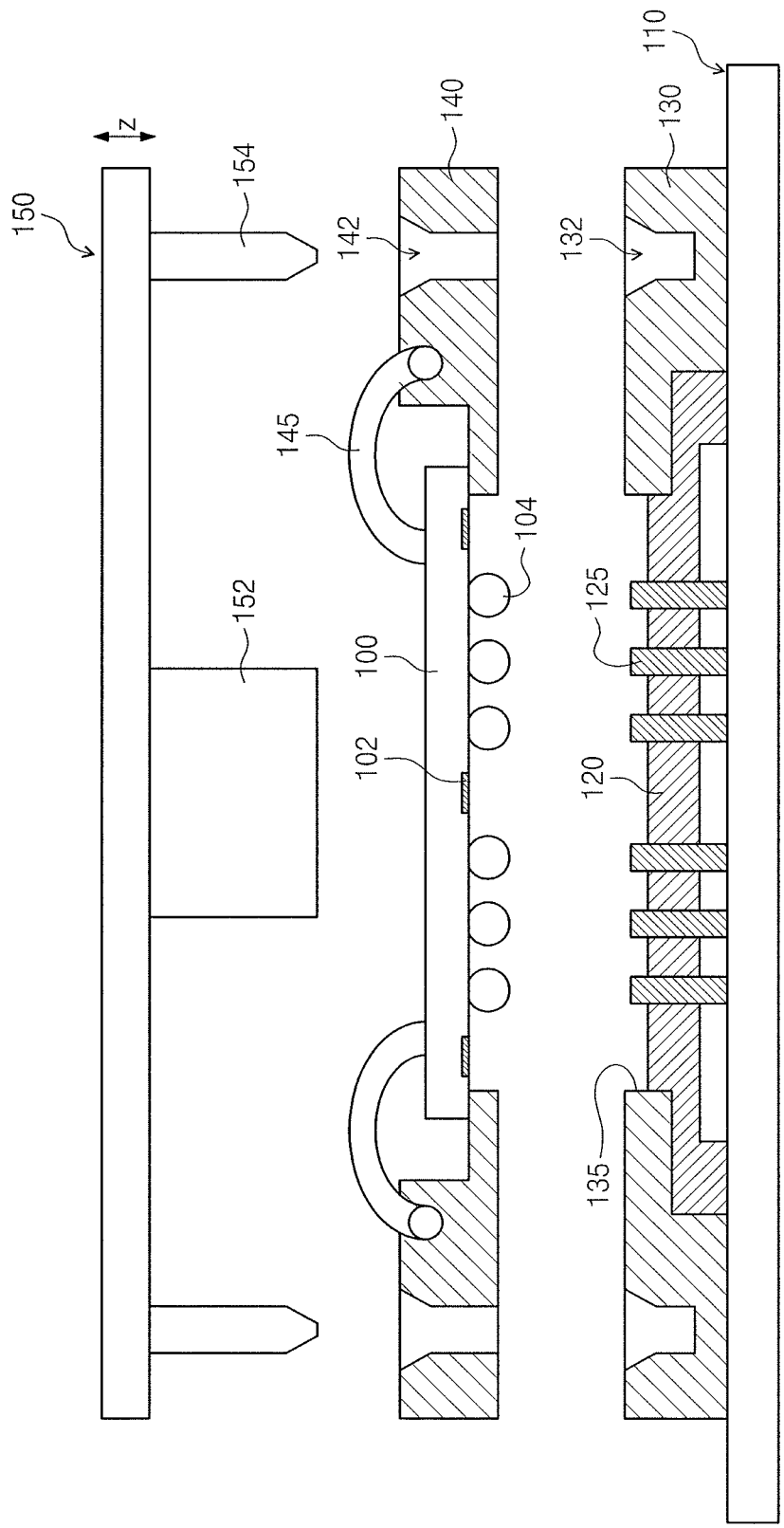

FIGS. 1 and 2 illustrate sectional views schematically showing an apparatus and a method for testing a semiconductor package according to an embodiment.

Referring to FIGS. 1 and 2, a semiconductor package testing apparatus may include a test circuit substrate 110, a socket 120, a socket guide 130, an insert 140, a pusher 150, and an alignment part 160.

The test circuit substrate 110 may include a test circuit for electrically testing the semiconductor package 100. The socket 120 may be configured to electrically connect the test circuit substrate 110 with the semiconductor package 100. The socket 120 may include contact terminals 125, which may electrically connect the test circuit of the test circuit substrate 110 with connection terminals 104 of the semiconductor package 100. In an implementation, each of the contact terminals 125 may be provided in a form of a pogo pin. The socket guide 130 may have an open region 135 delimiting or defining a boundary of the socket 120. For example, the open region 135 may be a region in which the semiconductor package 100 is inserted.

The insert 140 may fix a position of the semiconductor package 100 to facilitate insertion of the semiconductor package 100 into the open region 135 of the socket guide 130. For example, the insert 140 may include a latch 145 that fixes the position of the semiconductor package 100. As a result, a limitation in a size of the semiconductor package 100 accommodated by the insert 140 may be reduced, compared with a case of using an inner wall of the insert 140 to hold the semiconductor package 100. The pusher 150 may push the semiconductor package 100 such that the connection terminals 104 of the semiconductor package 100 contact the contact terminals 125 of the socket 120. For example, the pusher 150 may move vertically, e.g., along a z-direction in FIGS. 1 and 2. In an implementation, the connection terminals 104 of the semiconductor package 100 may have a solder ball structure. In an implementation, each of the connection terminals 104 may have a pad structure exposed on a surface of the semiconductor package 100.

The alignment part 160 may selectively apply a magnetic force on or to a plurality of align keys 102, e.g., magnetic elements in the semiconductor package 100. Thus, the alignment part 160 may align the connection terminals 104 of the semiconductor package 100 with the contact terminals 125 of the socket 120. The alignment part 160 may include a magnet portion 162 (that provides or applies the magnetic force to the align keys 102), a magnetic shielding portion 164 (on the magnet portion 162), and alignment pins 166 (each alignment pin 166 being a magnetic element penetrating the magnetic shielding portion 164 to be connected to the magnet portion 162). In an implementation, the magnet portion 162 may be an electromagnet. The magnetic shielding portion 164 may allow a magnetic flux to pass through alignment pins 166, e.g., magnetic elements, and to reduce a magnetic flux passing through the magnetic shielding portion 164. Due to the presence of the magnetic shielding portion 164, a magnetic force may be exchanged between the alignment pin 166 and the semiconductor package 100. For example, the alignment pin 166 may be precisely aligned with the, e.g., alignment keys 102 of the semiconductor package 100. In an implementation, the magnetic shielding portion 164 may be formed of a material capable of focusing the magnetic flux to the alignment pins 166. In an implementation, the alignment pins 166 may be formed of a magnetic material. In an implementation, and the align keys 102 of the semiconductor package 100 and the alignment pins 166 of the alignment part 160 may be formed of ferromagnetic materials. For example, the align keys 102 of the semiconductor package 100 and the alignment pins 166 of the alignment part 160 may be formed of nickel (Ni). In an implementation, the align keys 102 of the semiconductor package 100 may be dummy pads, which may not be electrically connected to the test circuit of the test circuit substrate 110 in electric testing operations.

A method of testing a semiconductor package may be performed using the above-described semiconductor package testing apparatus. The method may include preparing the semiconductor package 100 (including the connection terminals 104 and the align keys 102), loading the semiconductor package 100 on the insert 140, selectively applying a magnetic force onto the align keys 102 of the semiconductor package 100 to align the connection terminals 104 of the semiconductor package 100 with the corresponding contact terminals 125 of the socket 120, pressing the semiconductor package 100 to place the contact terminals 125 of the socket 120 in contact with the connection terminals 104 of the semiconductor package 100, and operating the test circuit of the test circuit substrate 110 to test the semiconductor package 100.

In an implementation, after loading the semiconductor package 100 on the insert 140, a first magnetic force may be selectively applied to the align keys 102 of the semiconductor package 100 using the alignment part 160 in such a way that the align keys 102 of the semiconductor package 100 can be aligned with corresponding ones of the contact terminals 125 of the socket 120. The alignment part 160 may be configured such that the first magnetic force is parallel with a direction toward the socket 120. For example, the magnet portion 162 of the alignment part 160 may have an N-pole facing the socket 120 and an S-pole facing the semiconductor package 100.

In an implementation, after aligning the connection terminals 104 with the contact terminals 125, a second magnetic force, a direction thereof being opposite to that of the first magnetic force, may be selectively applied to the align keys 102 of the semiconductor package 100. The second magnetic force may be parallel with a direction toward the semiconductor package 100. For example, the magnet portion 162 of the alignment part 160 may have an S-pole facing the socket 120 and an N-pole facing the semiconductor package 100. Applying of the second magnetic force may help ensure that any remnant magnetism of the align keys 102 is removed. Thus, it may be possible to prevent extraneous matter from being adsorbed to the semiconductor package 100 due to remnant magnetism of the align keys 102.

After aligning the connection terminals 104 with the contact terminals 125 using the alignment part 160, the semiconductor package 100 may be fixed to the insert 140 using the latch 145. Then, the alignment part 160 may be horizontally moved away from between the semiconductor package 100 and the socket 120 (e.g., along the x- or y-axis). Alternatively, the semiconductor package 100 may be aligned with the insert 140 at an outside or an exterior thereof. Then, the insert 140 (with the semiconductor package 100 thereon) may be moved into a space between the socket 120 and the pusher 150.

The pusher 150 may move downwardly to press the semiconductor package 100 on the insert 140. As a result, the connection terminals 104 of the semiconductor package 100 may be brought into contact with the contact terminals 125 of the socket 120. Thus, the semiconductor package 100 may be ready for testing. In an implementation, during the pressing, a pressing tab 152 of the pusher 150 may press the semiconductor package 100 that is fixed on the insert 140, and guide pins 154 of the pusher 150 may be inserted into an insert guide hole 142 (at an edge portion of the insert 140 to penetrate the insert 140) and a socket guide hole 132 (at an edge portion of the socket guide 130).

The test circuit of the test circuit substrate 110 may be operated to test the semiconductor package 100 under an operation condition where the connection terminals 104 are electrically connected to the contact terminals 125.

Figure 3:
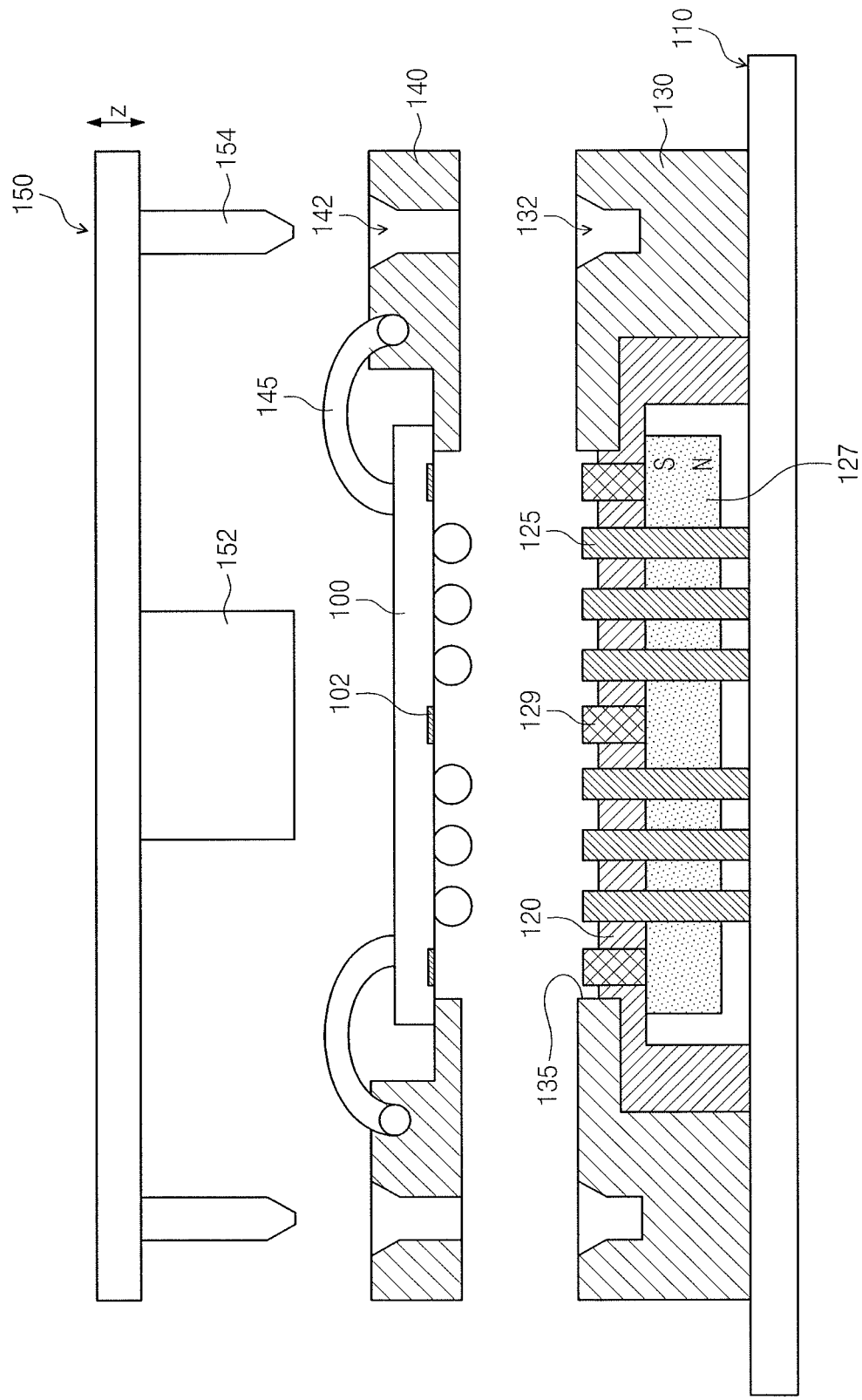
FIG. 3 illustrates a sectional view schematically showing an apparatus for testing a semiconductor package according to an embodiment.

Hereinafter, an apparatus for a testing a semiconductor package according to an embodiment will be described with reference to FIGS. 3 and 4. FIGS. 3 and 4 illustrate sectional views schematically showing apparatus for a testing a semiconductor package according to an embodiment. For concise description, a previously described element may be identified by an identical reference number without repeating a description thereof.

The semiconductor package testing apparatus of FIG. 3 may differ from the apparatus described with reference to FIG. 1 in that the alignment part may be a structure embedded within the socket 120.

A magnet portion 127, which may correspond to the element denoted by the reference numeral 160 of FIG. 1, e.g., the alignment part 160, may be provided within the socket 120. In an implementation, the socket 120 may perform the same function as the magnetic shielding portion 164 of FIG. 1, and alignment pins 129 may be connected to the magnet portion 127 through the socket 120. For example, the semiconductor package testing apparatus may not to include an additional part for moving the alignment part.

The semiconductor package testing apparatus of FIG. 4 may differ from the apparatus described with reference to FIG. 1 in that an align key of the semiconductor package 100 may be provided in a form of solder ball.

In an implementation, the semiconductor package 100 may include dummy solder balls 104d, which may be formed of a magnetic material, to serve as the align key. For example, the dummy solder balls 104d of the semiconductor package 100 may be formed of a ferromagnetic material (e.g., nickel (Ni)). In an implementation, the dummy solder balls 104d of the semiconductor package 100 may not be electrically connected to the test circuit of the test circuit substrate 110 in electric testing operations.

By way of summation and review, presently available ball grid array (BGA)-type semiconductor package products may have a minimum ball pitch of 0.4 mm. However, future semiconductor packages may have a minimum ball pitch of about 0.3 mm or less. It is expected that some semiconductor package testing apparatuses cannot be used to align a contact terminal (or contactor) precisely to a solder ball.

If the solder ball is connected to the contactor in a misaligned manner, the solder ball may be in contact with an edge portion of the contactor. Such a misaligned contact may lead to abrasion of the contactor, an increase in contact resistance caused by the abrasion, and a reduction in reliability of a testing process. Furthermore, if semiconductor packages with a solder ball pitch of about 0.3 mm or less were to be aligned in such a manner, a solder ball may be electrically connected to a contact terminal adjacent thereto, due to a reduced misalign margin (e.g., half the pitch).

The semiconductor package testing apparatus according to an embodiment may be configured to align the semiconductor package (in which alignment keys are formed of a magnetic material) using a magnetic force. As a result, it is possible to realize highly precise alignment of a semiconductor package, even when the semiconductor package has a fine solder ball pitch.

The semiconductor package testing apparatus according to an embodiment may be configured to align the semiconductor package with the socket using a magnetic force. As a result, it is possible to realize highly precise alignment of the semiconductor package, even when the semiconductor package has a fine solder ball pitch. Such a precise alignment may help reduce and/or suppress mechanical wear of the contact terminals. As a result, it is possible to reduce and/or prevent an increase in contact resistance (caused by abrasion) and a reduction in reliability of testing operation, which may occur when there is a misalignment between the solder ball and the contact terminal. In addition, it is possible to prevent an electrical short between a solder ball and a contact terminal adjacent thereto, which may occur when semiconductor packages with a solder ball pitch of 0.3 mm or less are tested. Semiconductor packages with a fine solder ball pitch may be precisely aligned and may be reliably tested by the semiconductor package testing apparatus according to an embodiment.

The semiconductor packages according to an embodiment may be encapsulated using various and diverse packaging techniques. For example, the semiconductor packages according to an embodiment may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique, or may be provided as a portion of other semiconductor package.

The embodiments provide apparatus for testing electric characteristics of semiconductor packages and test methods using the same.

The embodiments provide semiconductor package testing apparatus capable of realizing precise alignment and reliable testing of a semiconductor package.

Similarly, the embodiments also provide semiconductor package testing methods configured to realize precise alignment and reliable testing of a semiconductor package.

According to an embodiment, the semiconductor package testing apparatus may be configured to align the semiconductor package with the socket using a magnetic force. Accordingly, highly precise alignment of a semiconductor package may be realized, even when the semiconductor package has a fine solder ball pitch. Thus, a semiconductor package testing apparatus capable of testing semiconductor packages with a solder ball pitch of 0.3 mm or less may be realized.

According to an embodiment, the semiconductor package testing method may include aligning the semiconductor package using a magnetic force. Due to the use of the magnetic force, a semiconductor package with a fine solder ball pitch may be precisely aligned. For example, semiconductor packages with a solder ball pitch of 0.3 mm or less may be reliably tested using the semiconductor package testing method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is

1. A semiconductor package testing apparatus, comprising:

a test circuit substrate that electrically tests a semiconductor package having connection terminals;

a socket electrically connecting the test circuit substrate with the semiconductor package;

a socket guide having an open region delimiting the socket;

an insert that fixes the semiconductor package and positions the semiconductor package in the open region of the socket guide;

a pusher that presses the semiconductor package to make contact between the socket and the semiconductor package; and an alignment part that aligns the semiconductor package with the open region, wherein:

the alignment part is configured to selectively apply a magnetic force to align keys of the semiconductor package, the align keys being formed of a magnetic material, and the alignment part includes:

a magnet portion that applies the magnetic force to the align keys of the semiconductor package;

a magnetic shielding portion on the magnet portion; and alignment pins connected to the magnet portion through the magnetic shielding portion, the alignment pins being magnetic elements corresponding to the align keys of the semiconductor package.

2. The apparatus as claimed in claim 1, wherein the align keys of the semiconductor package are formed of a ferromagnetic material.

3. The apparatus as claimed in claim 1, wherein the align keys of the semiconductor package are dummy pads.

4. The apparatus as claimed in claim 1, wherein the align keys of the semiconductor package are provided in a form of a dummy solder ball.

5. The apparatus as claimed in claim 1, wherein the alignment pins are formed of a ferromagnetic material.

6. The apparatus as claimed in claim 1, wherein:

the magnet portion is disposed within the socket, and the alignment pins are connected to the magnet portion through the socket.

7. The apparatus as claimed in claim 1, wherein the insert further includes a latch for fixing the semiconductor package aligned by the alignment part.

8. The apparatus as claimed in claim 1, wherein the socket includes contact terminals corresponding to the connection terminals of the semiconductor package.

9. A testing apparatus for testing a semiconductor package having connection terminals and magnetic align keys, the apparatus comprising:

a test circuit substrate having a test circuit;

a socket, the socket including contact terminals that electrically connect the test circuit substrate with the semiconductor package;

a socket guide, the socket guide having an opening accommodating the socket; and an alignment part, the alignment part selectively applying a magnetic force to the align keys of the semiconductor package and aligning the semiconductor package with the opening, wherein the alignment part includes:

a magnet portion, the magnet portion applying the magnetic force to the align keys of the semiconductor package;

a magnetic shielding portion on the magnet portion; and alignment pins connected to the magnet portion through the magnetic shielding portion, the alignment pins being magnetic elements that correspond to the align keys of the semiconductor package.

10. The apparatus as claimed in claim 9, wherein the align keys of the semiconductor package are provided in a form of dummy solder balls or dummy pads.

11. The apparatus as claimed in claim 9, wherein:

the magnet portion is disposed within the socket, and the alignment pins are connected to the magnet portion through the socket.

12. The apparatus as claimed in claim 9, further comprising an insert, the insert fixing the aligned semiconductor package on the opening of the socket guide, wherein the insert further includes a latch, the latch fixing the semiconductor package aligned by the alignment part.

* * * * *